(12) United States Patent
Sakurada

(10) Patent No.: US 7,226,642 B2
(45) Date of Patent: Jun. 5, 2007

(54) SYSTEM AND METHODS FOR MANUFACTURING A LIQUID CRYSTAL DEVICE

(75) Inventor: Kazuaki Sakurada, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 306 days.

(21) Appl. No.: 10/368,607

(22) Filed: Feb. 20, 2003

(65) Prior Publication Data

US 2003/0165629 A1 Sep. 4, 2003

(30) Foreign Application Priority Data

Feb. 22, 2002 (JP) .............................. 2002-046295

(51) Int. Cl.
*B05D 5/00* (2006.01)
(52) U.S. Cl. ................ 427/421.1; 427/424; 427/427.3; 427/256; 427/58
(58) Field of Classification Search .................. 427/58, 427/256, 421.1, 424, 427.3
See application file for complete search history.

(56) References Cited

U.S. PATENT DOCUMENTS

| | | | | |
|---|---|---|---|---|
| 4,839,202 A | * | 6/1989 | Grassel et al. | 427/424 |
| 4,866,466 A | * | 9/1989 | van der Waal | 396/547 |
| 5,681,675 A | * | 10/1997 | Kurauchi et al. | 430/20 |
| 5,976,256 A | | 11/1999 | Kawano | |
| 6,145,981 A | * | 11/2000 | Akahira et al. | 347/107 |
| 6,514,343 B1 | | 2/2003 | Motoda | |

FOREIGN PATENT DOCUMENTS

| | | |
|---|---|---|
| JP | A-01-161218 | 6/1989 |
| JP | A-6-198906 | 7/1994 |
| JP | A-7-132604 | 5/1995 |
| JP | A-9-39220 | 2/1997 |
| JP | A-2001-51269 | 2/2001 |
| JP | A-2001-162207 | 6/2001 |
| JP | A-2001-239199 | 9/2001 |
| JP | A-2001-337316 | 12/2001 |
| KR | A-1998-42825 | 8/1998 |

* cited by examiner

*Primary Examiner*—Alain L. Bashore
(74) *Attorney, Agent, or Firm*—Oliff & Berridge, PLC

(57) ABSTRACT

The invention provides a thin-film forming device, a thin-film forming method, a device for manufacturing a liquid crystal display, a method for manufacturing a liquid crystal display, a device for manufacturing a thin-film structure, a method for a thin-film structure, a liquid crystal display, a thin-film structure, and an electronic apparatus, objects are to achieve easy control of thickness of a thin film without using rotation means, cost reduction, and miniaturization of the devices. The thin-film forming device for forming a thin film by applying a coating solution onto a substrate, there can be provided an ejection mechanism having a droplet ejection head for ejecting the coating solution onto the substrate, a moving mechanism capable of relatively moving the positions of the droplet ejection head and the substrate, and a control unit for controlling at least one of the ejection mechanism and the moving mechanism. As a result, the control unit described above can control the thickness of the thin film by changing the coating conditions of the coating solution L by controlling at least one of an ejection operation by the ejection mechanism and a moving operation by the moving mechanism.

11 Claims, 6 Drawing Sheets

SYSTEM AND METHODS FOR MANUFACTURING A LIQUID CRYSTAL DEVICE

BACKGROUND OF THE INVENTION

1. Field of Invention

The present invention relates to thin-film forming devices for forming thin films by applying a coating solution onto a substrate, thin-film forming methods, devices for manufacturing liquid crystal displays, methods for manufacturing liquid crystal displays, devices for manufacturing thin-film structures, methods for manufacturing thin-film structures, liquid crystal displays, thin-film structures, and electronic apparatuses. In particular, the present invention relates to a preferable device and method capable of easily and accurately controlling the thickness of a thin-film.

2. Description of Related Art

Currently, a spin coating method used as one of techniques for forming thin films is a method for forming a thin film by dripping a coating solution onto a substrate and subsequently applying the coating solution over the entire substrate using a centrifugal force generated by rotating the substrate. In this method, the film thickness is controlled by a rotation speed, a rotation time, and viscosity of the coating solution. This spin coating method has been widely used, for example, for the formation of photoresist films or interlayer insulating films such as SOG (spin on glass) in a semiconductor manufacturing process or the like. The method has also been used in the formation of alignment films in a process for manufacturing liquid crystal displays or the like, and the formation of protection films in a process for manufacturing optical discs or the like.

In this spin coating method, since most of the coating solution thus supplied is scattered, a large quantity of the coating solution must be supplied, and at the same time, the waste thereof is large, resulting in disadvantageous increase in cost. In addition, since the substrate is rotated, the coating solution flows from the inside to the outside due to a centrifugal force, and as a result, the thickness at the peripheral region tends to be thick as compared to that at the inside region, resulting in problem of uneven film thickness. As measures against the disadvantages described above, in recent years, a coating method using a so-called inkjet technique has been proposed.

For example, in Japanese Unexamined Patent Application Publication Nos. 9-10657, 8-196983, and 9-192573, techniques have been disclosed in which a rotation technique for rotating a substrate is provided. In these techniques, a coating solution ejected onto the substrate by a droplet ejection head is moved by the rotation movement of the substrate, and the thickness of a thin film made of the coating solution is controlled by changing the rotation speed of the substrate, rotation time, and the like.

SUMMARY OF THE INVENTION

However, in the conventional techniques described above, there have been the following problems. That is, according to the coating technique using a rotation technique for rotating the substrate, since rotation must be used, the thickness uniformity at four corners of a rectangular substrate or end portions of a large substrate, which are used for a liquid crystal display or the like, becomes inferior to that at the central portion of the substrate. In addition, since a device provided with rotation is necessary, the device cost is increased, and in addition, an increased installation area for the device must be disadvantageously secured. In particular, in recent years, concomitant with increase in size of substrates for liquid crystal displays, semiconductors, and the like, the size of the conventional device has been inevitably increased. Hence, a technique capable of decreasing the size of a manufacturing device has been desired.

The present invention was made in consideration of the problems described above, and an object of the present invention is to provide a thin-film forming device which can easily control the thickness of a thin film without using rotation, and which can be manufactured at a lower cost and can be miniaturized. In addition, the present invention provides a thin-film forming method, a device for manufacturing a liquid crystal display, a method for manufacturing a liquid crystal display, a device for manufacturing a thin-film structure, a method for manufacturing a thin-film structure, a liquid crystal display, a thin-film structure, and an electronic apparatus.

In order to solve the problems described above, the present invention employs the structure described below. That is, a thin-film forming device of the present invention is a thin-film forming device for forming a thin film by applying a coating solution onto a substrate. The device can include an ejection mechanism having a droplet ejection head for ejecting the coating solution onto the substrate, a moving mechanism capable of relatively moving the positions of the droplet ejection head and the substrate, and a control unit for controlling at least one of the ejection mechanism and the moving mechanism. In this device described above, the control unit can change coating conditions of the coating solution by controlling at least one of an ejection operation by the ejection mechanism and a moving operation by the moving mechanism so as to control the thickness of the thin film.

In addition, a thin-film forming method of the present invention is a method which applies a coating solution onto a substrate for forming a thin film by using an ejection mechanism having a droplet ejection head for ejecting the coating solution onto the substrate, a moving mechanism capable of relatively moving the positions of the droplet ejection head and the substrate, and a control unit for controlling at least one of the ejection mechanism and the moving mechanism. The method described above can include changing coating conditions of the coating solution by controlling at least one of an ejection operation by the ejection mechanism and a moving operation by the moving mechanism by using the control unit so as to control the thickness of the thin film.

According to the thin-film forming device and the thin-film forming method described above, in order to control the thickness of the thin film, the coating conditions are changed by controlling at least one of the ejection operation by the ejection mechanism and the moving operation by the moving mechanism by using the control unit. Hence, the thickness of the thin film can be easily and highly accurately controlled without using rotation for the substrate, and in addition, miniaturization and cost reduction of the device can be achieved.

According to the thin-film forming device of the present invention, the control unit can change ejection spatial intervals for ejecting the coating solution onto the substrate.

In addition, according to the thin-film forming method of the present invention, the control unit can change ejection spatial intervals for ejecting the coating solution onto the substrate.

According to the thin-film forming device and the thin-film forming method described above, since the control unit changes the ejection spatial intervals for ejecting the coating solution onto the substrate, when the ejection spatial intervals are decreased, the coating amount per unit area on the surface of the substrate is increased, thereby increasing the film thickness. In addition, when the ejection spatial intervals are increased, the coating amount per unit area on the surface of the substrate is decreased, thereby decreasing the film thickness. Accordingly, the thickness of the thin film can be easily and highly accurately controlled.

According to the thin-film forming device of the present invention, the control unit can change the ejection spatial intervals by changing a speed of the moving operation described above. In addition, according to the thin-film forming method of the present invention, the control unit can change the ejection spatial intervals by changing a speed of the moving operation described above.

According to the thin-film forming device and the thin-film forming method described above, since the control unit changes the ejection spatial intervals by changing the relative moving speed between the droplet ejection head and the substrate, when the moving speed is increased, the coating amount per unit moving length is decreased, thereby decreasing the film thickness, and on the other hand, when the moving speed is decreased, the coating amount per unit moving length is increased, thereby increasing the film thickness.

According to the thin-film forming device of the present invention, the control unit can change the ejection spatial intervals by changing ejection time intervals while the droplet ejection head and the substrate are relatively moved. In addition, according to the thin-film forming method of the present invention, the control unit can change the ejection spatial intervals by changing ejection time intervals while the droplet ejection head and the substrate are relatively moved.

According to the thin-film forming device and the thin-film forming method described above, since the control unit changes the ejection spatial intervals by changing the time intervals for ejection while the droplet ejection head and the substrate are relatively moved, when the time intervals for ejection are decreased, the coating amount per unit moving length is increased, thereby increasing the film thickness, and on the other hand, when the time intervals for ejection are increased, the coating amount per unit moving length is decreased, thereby decreasing the film thickness.

According to the thin-film forming device of the present invention, the droplet ejection head can be provided with a plurality of nozzles aligned in at least one line, and the control unit optionally assigns some nozzles among said plurality of nozzles to simultaneously eject the coating solution for changing the ejection spatial intervals.

In addition, according to the thin-film forming method of the present invention, the droplet ejection head can be provided with a plurality of nozzles aligned in at least one line, and the control unit optionally assigns some nozzles among said plurality of nozzles to simultaneously eject the coating solution for changing the ejection spatial intervals.

According to the thin-film forming device and the thin-film forming method described above, since the control unit changes the ejection spatial intervals by optionally assigning some nozzles among said plurality of nozzles to simultaneously eject the coating solution, when the number of the nozzles performing the simultaneous ejection are larger and the distances therebetween are smaller, the coating amount per unit area becomes larger, thereby increasing the film thickness, and on the other hand, when the number of the nozzles performing the simultaneous ejection are smaller and the distances therebetween are larger, the coating amount per unit area becomes smaller, thereby decreasing the film thickness.

According to the thin-film forming device of the present invention, the control unit can change the ejection amount of the coating solution per dot. In addition, according to the thin-film forming method of the present invention, the control unit can change the ejection amount of the coating solution per dot.

According to the thin-film forming device and the thin-film forming method described above, since the control unit changes the ejection amount of the coating solution per dot, and the coating amount per unit area is changed in proportion to the ejection amount, the film thickness can be increased when the ejection amount is increased and can be decreased when it is decreased.

According to the thin-film forming device of the present invention, the droplet ejection head can be provided with a plurality of nozzles aligned in at least one line, and the control unit changes the ejection amount ejected from each of said plurality of nozzles.

In addition, according to the thin-film forming method of the present invention, the droplet ejection head can be provided with a plurality of nozzles aligned in at least one line, and the control unit changes the ejection amount ejected from each of said plurality of nozzles.

According to the thin-film forming device and the thin-film forming method described above, since the control unit changes the ejection amount ejected from each of said plurality of nozzles, the coating amount can be optionally changed in accordance with the position of each nozzle and the ejection amount therefrom, and hence various film thickness control can be performed. For example, when the ejection amount from every other nozzle is decreased, the coating amount is decreased on the whole as compared to that obtained in the case in which all the nozzles eject the same amount, thereby decreasing the film thickness.

According to the thin-film forming device of the present invention, the droplet ejection head can be provided with a plurality of nozzles aligned in at least one line, and the control unit changes an angle formed by the alignment direction of the nozzles and the moving direction by the moving mechanism.

In addition, according to the thin-film forming method of the present invention, the droplet ejection head can be provided with a plurality of nozzles aligned in at least one line, and the control unit changes an angle formed by the alignment direction of the nozzles and the moving direction by the moving mechanism.

According to the thin-film forming device and the thin-film forming method described above, since the control unit changes the angle formed by the alignment direction of the nozzles and the moving direction by the moving mechanism, for example, when the droplet ejection head is inclined with respect to the moving direction, an apparent nozzle pitch is decreased, and hence the coating amount per unit moving length is increased, thereby increasing the film thickness.

According to the thin-film forming device of the present invention, when the coating is repeatedly performed on the substrate, the control unit sets the coating conditions for each coating. In addition, according to the thin-film forming method of the present invention, when the coating is repeatedly performed on the substrate, the control unit sets the coating conditions for each coating.

According to the thin-film forming device and the thin-film forming method described above, when the coating is repeatedly performed on the substrate, since the control unit sets the coating conditions for each coating, for example, the coating conditions performed for first coating can be changed for subsequent coating in consideration of characteristics such as a drying characteristic (volatility) of the coating solution, and hence the coating can be repeatedly performed in consideration of the state of the coating solution L.

According to the thin-film forming device of the present invention, the control unit sets the coating conditions for each of a plurality of regions on the substrate. In addition, according to the thin-film forming method of the present invention, the control unit sets the coating conditions for each of a plurality of regions on the substrate.

According to the thin-film forming device and the thin-film forming method described above, since the control unit sets the coating conditions for each of said plurality of regions on the substrate, the film thickness can be optionally set in each region, and in addition, by finely adjusting the coating amount in each region in consideration of characteristics such as a drying characteristic (volatility) of the coating solution in said each region, more highly accurate uniformity of the film thickness can be obtained. For example, when the thickness at the peripheral portion of the substrate tends to be large as compared to that at the central portion thereof, the coating amount can be controlled beforehand so that the thickness at the peripheral portion is smaller than that of the central portion.

According to the thin-film forming device of the present invention, the coating solution can be a photoresist solution. In addition, according to the thin-film forming method of the present invention, the coating solution can be a photoresist solution.

According to the thin-film forming device and the thin-film forming method described above, since the coating solution is a photoresist solution, the thickness of a photoresist film can be controlled with high accuracy in a photolithographic step used in a manufacturing process for a liquid crystal display, a semiconductor device, or the like, thereby obtaining superior exposure accuracy.

A device for manufacturing a liquid crystal display, according to the present invention, can be a device for manufacturing a liquid crystal display including a pair of substrates, liquid crystal provided therebetween, and an alignment film and an insulating film provided on at least one of the substrates. The device described above can include the thin-film forming device of the present invention described above, wherein the thin-film forming device forms at least one of the alignment film and the insulating film.

A method for manufacturing a liquid crystal display, according to the present invention, is a method for manufacturing a liquid crystal display including a pair of substrates, liquid crystal provided therebetween, and an alignment film and an insulating film provided on at least one of the substrates. The method described above can include forming at least one of the alignment film and the insulating film by the thin-film forming method of the present invention described above.

In addition, a liquid crystal display of the present invention is a liquid crystal display including a pair of substrates, liquid crystal provided therebetween, and an alignment film and an insulating film provided on at least one of the substrates, wherein at least one of the alignment film and the insulating film is formed by the thin-film forming method of the present invention described above.

According to the liquid crystal display and the device and method for manufacturing the same, since at least one of the alignment film and the insulating film is formed by the thin-film forming device or the thin-film forming method according to the present invention described above, an alignment film and an insulating film each having superior thickness uniformity over the entire substrate can be easily obtained.

A device for manufacturing a thin-film structure, according to the present invention, is a device for manufacturing a thin-film structure having a substrate and a thin film formed thereon and can include the thin-film forming device of the present invention described above, wherein the thin-film forming device described above forms the thin film.

A method for manufacturing a thin-film structure, according to the present invention, is a method for manufacturing a thin-film structure having a substrate and a thin film formed thereon and can include forming the thin film by the thin-film forming method of the present invention described above.

In addition, a thin-film structure of the present invention is a thin-film structure having a substrate and a thin film formed thereon, wherein the thin film is formed by the thin-film forming method of the present invention described above.

According to the thin-film structure and the device and method for manufacturing the same, since the thin film is formed by the thin-film forming device or the thin-film forming method according to the present invention described above, even in the thin-film structure such as an optical disc, a thin film such as a protection film having superior thickness uniformity over the entire substrate can be easily obtained.

In addition, an electronic apparatus of the present invention can include the liquid crystal display of the present invention described above. Since this electronic apparatus comprises the liquid crystal display of the present invention, an electronic apparatus having a high quality display portion can be realized by the presence of the alignment film or the insulating film having superior thickness uniformity.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Figure 1:
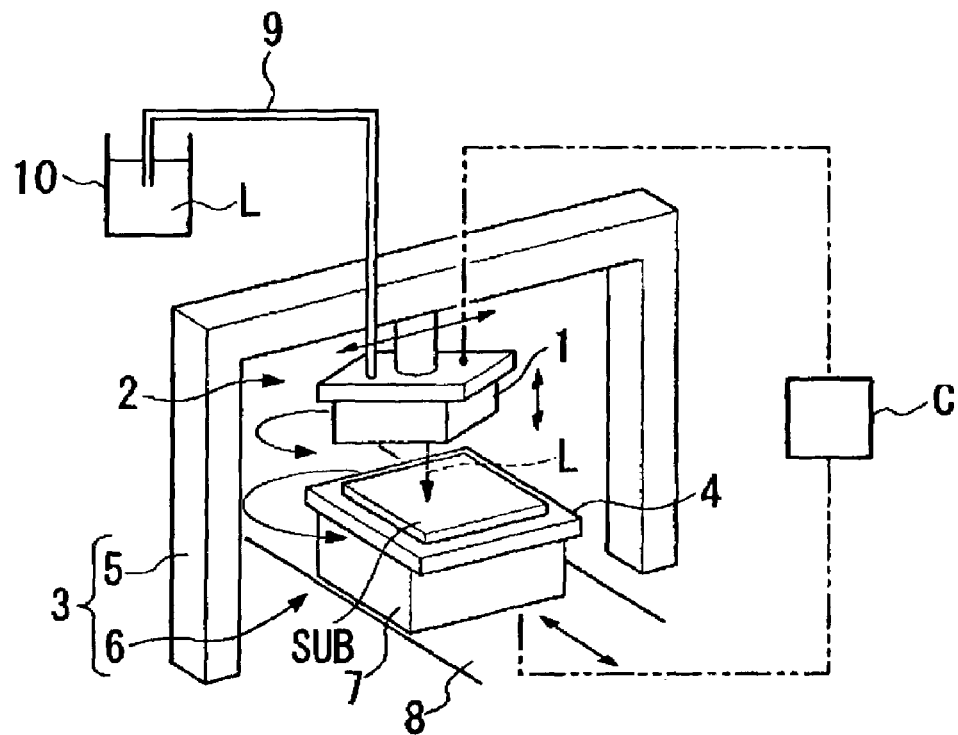
FIG. 1 is a perspective view showing the schematic structure of a thin-film forming device of a first embodiment according to the present invention.

Hereinafter, a first embodiment of the present invention will be described with reference to FIGS. 1 to 4. FIG. 1 is a view showing a thin-film forming device for forming, for example, a polyimide-based alignment film (thin film) by applying a coating solution L onto a substrate SUB provided with pixel electrodes used for a liquid crystal display device (liquid crystal display). This thin-film forming device comprises an ejection mechanism 2 having a droplet ejection head 1 for ejecting the coating solution L onto the substrate SUB, a moving mechanism 3 capable of relatively moving the positions of the droplet ejection head 1 and the substrate SUB, and a control C for controlling the ejection mechanism 2 and the moving mechanism 3.

The moving mechanism 3 can include a head supporter 5 for supporting the droplet ejecting head 1 at a position over the substrate SUB provided on a substrate stage 4 so that the head 1 faces downward and for moving the droplet ejection head 1 to an optional position with respect to the substrate SUB, and a stage driver 6 for moving the substrate SUB together with the substrate stage 4 with respect to the droplet ejecting head 1 which is provided at the upper side.

The head supporter 5 can include a mechanism, such as a linear motor, capable of moving the droplet ejection head 1 in the horizontal direction (X axis) and the vertical direction (Z axis) at an optional moving speed and positioning the droplet ejection head 1, and a mechanism such as a stepping motor capable of setting the droplet ejecting head 1 at an optional angle with respect to the substrate SUB provided at the lower side by rotating the droplet ejecting head 1 about a vertical central axis.

The stage driver 6 can include a θ axis stage 7 capable of setting the substrate stage 4 at an optional angle with respect to the droplet ejection head 1 by rotation about the vertical central axis, and a Y axis stage 8 capable of moving the substrate stage 4 in the horizontal direction (Y axis) orthogonally intersecting the horizontal moving direction of the droplet ejection head 1 and of positioning the substrate stage 4. In addition, the θ axis stage 7 is formed of a stepping motor or the like, and the Y axis stage 8 is formed of a linear motor or the like.

The ejection mechanism 2 can have a tank 10 connected to the droplet ejection head 1 through a tube 9, and the tank 10 stores the coating solution L to be supplied to the droplet ejection head 1. In other words, coating is performed by supplying the coating solution stored in the tank 10 to the droplet ejection head 1 through the tube 9.

Figure 2:
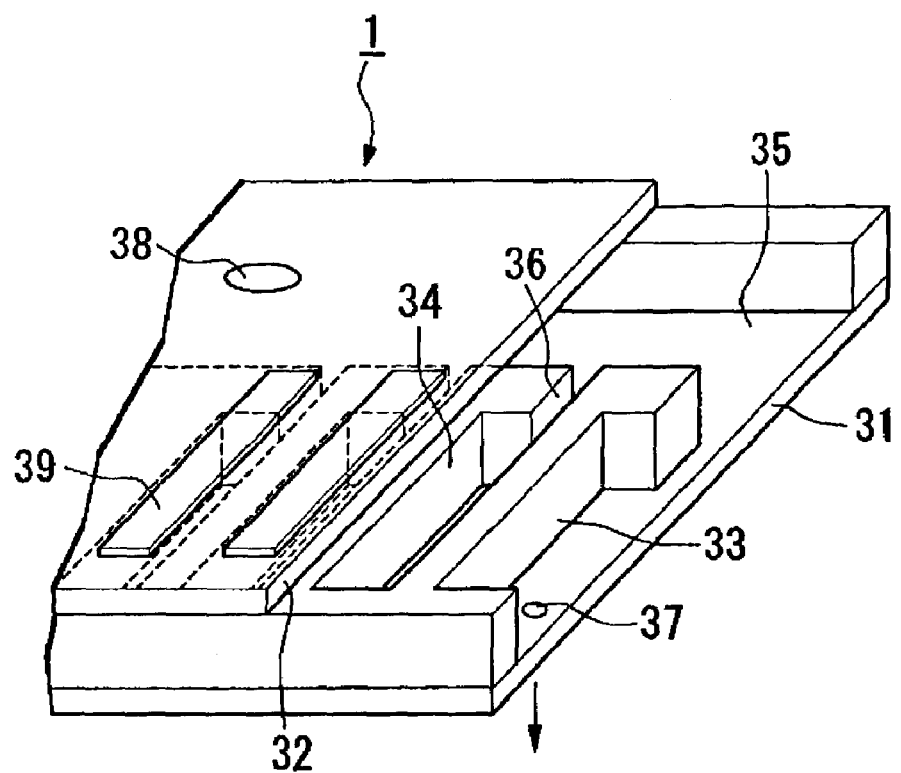
FIG. 2 is a perspective view showing the structure of a droplet ejection head of the thin-film forming device of the first embodiment according to the present invention.
Figure 3:
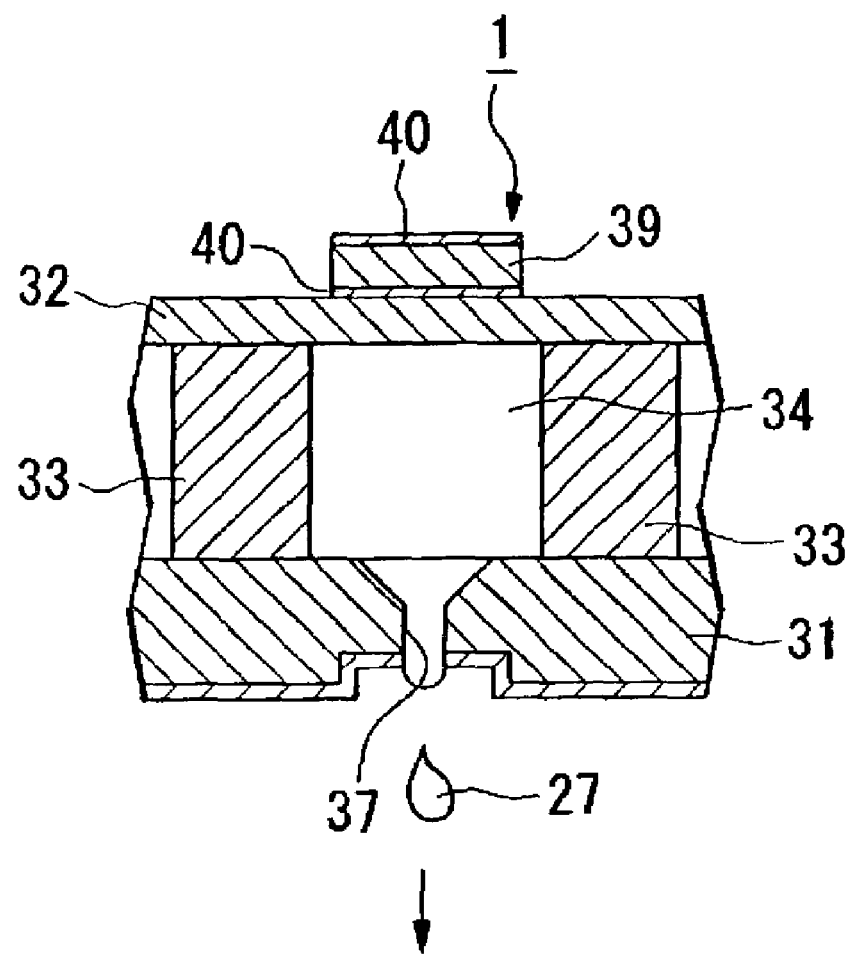
FIG. 3 is a cross-sectional view showing the structure of the droplet ejection head of the thin-film forming device of the first embodiment according to the present invention.

The droplet ejection head 1 is to eject a liquid material by a pressure wave generated by compressing a room in which the coating solution is contained using a piezoelectric element or the like and has a plurality of nozzles (nozzle holes) aligned in at least one line. One example of the structure of this droplet ejection head 1 will be described. As shown in FIGS. 2 and 3, the droplet ejection head 1 is composed, for example, of a nozzle plate 31 made of a stainless steel and a vibration plate 32 bonded thereto with a partition member (reserver plate) 33 provided therebetween. Between the nozzle plate 31 and the vibration plate 32, a plurality of spaces 34 and a liquid pool 35 are formed by the reserver plate 33. These spaces 34 are communicated with the liquid pool 35 through supply inlets 36. In addition, the nozzle plate 31 is provided with nozzles 37 for ejecting the coating solution L from the respective spaces 15. In the vibration plate 32, an opening 38 is formed for supplying the coating solution L into the liquid pool 35.

In addition, as shown in FIG. 2, a piezoelectric element 39 is bonded to the opposite surface of the vibration plate 32 from that facing the spaces 34. The piezoelectric element 39 is located between a pair of electrodes 40 and is warped so as to project outside when electricity is applied thereto, and the vibration plate 32 bonded to the piezoelectric element 39 is simultaneously warped outside therewith. As a result, the volume of the space 34 is increased thereby. Consequently, the coating solution L in an amount corresponding to the volume increased in the space 34 is supplied thereto from the liquid pool 35 through the supply inlet 36.

Next, when the application of the electricity to the piezoelectric element 39 is stopped, the piezoelectric element 39 and the vibration plate 32 return to the respective original shapes. Hence, the volume of the space 34 also returns to the original one, the pressure of the coating solution L inside the space 34 is increased, thereby ejecting a droplet 27 of the coating solution L to a substrate from the nozzle 37.

As a type of droplet ejection head 1, in addition to a piezoelectric jet type using the piezoelectric element described above, for example, a type provided with an electrothermal converter as an energy generation element may also be used.

The control unit C can be composed, for example, of a computer, which contains a CPU such as a microprocessor for controlling the entire device and has input/output functions of various signals, and is electrically connected to the ejection mechanism 2 and the moving mechanism 3 so as to control at least one of an ejection operation by the ejection mechanism 2 and a moving operation by the moving mechanism 3. Accordingly, the control unit C has functions of controlling the film thickness of an alignment film by changing the coating conditions of the coating solution L.

In other words, as the functions of controlling the film thickness, the control unit C has a control function of changing the ejection spatial intervals for the coating solution L onto the substrate SUB, a control function of changing the ejection amount of the coating solution L per dot, a control function of changing an angle θ formed by the alignment direction of the nozzles 37 and the moving direction by the moving mechanism 3, a control function of setting the coating conditions for each coating when the coating is repeatedly performed on the substrate SUB, and a control function of setting the coating conditions for each of a plurality of regions of the substrate SUB.

Furthermore, as the control function of changing the ejection spatial intervals described above, the control unit C has a control function of changing the ejection spatial intervals by changing a relative moving speed between the substrate SUB and the droplet ejection head 1, a control function of changing the ejection spatial intervals by changing ejection time intervals while moving, and a control function of changing the ejection spatial intervals by optionally assigning some nozzles among the plurality of the nozzles to simultaneously eject the coating solution L.

Next, a liquid crystal display having an alignment film formed by the thin-film forming device of this embodiment and a method for forming the alignment film will be described with reference to FIGS. 4 to 6.

Figure 4:
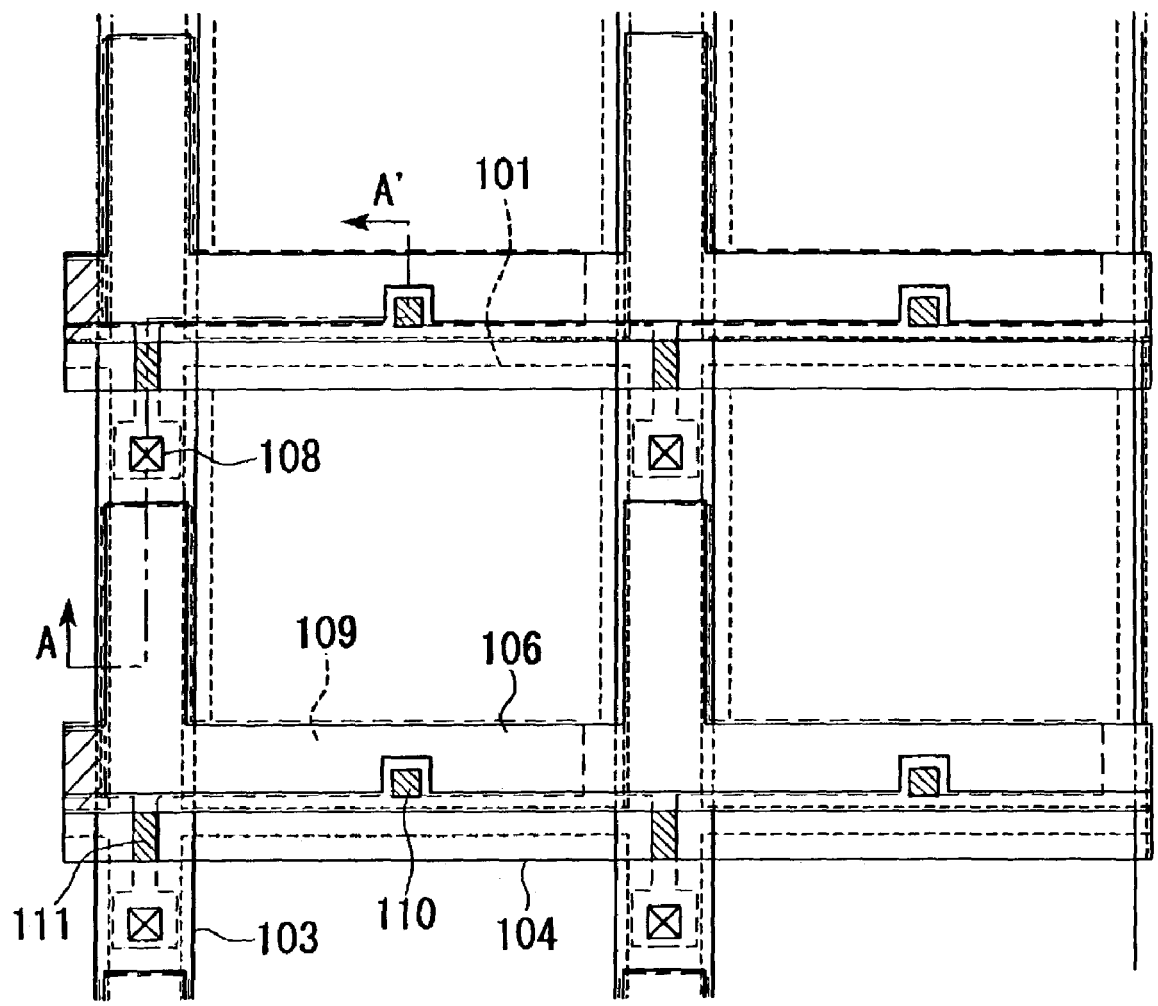
FIG. 4 is a plan view showing a plurality of adjoining pixels on a TFT array substrate forming a liquid crystal display of the first embodiment according to the present invention.

FIG. 4 is a view showing an example of the structure of a TFT array substrate, which is one of substrates of a TFT (thin-film transistor) type liquid crystal display having an alignment film formed by the thin-film forming device described above, and FIG. 5 is a view showing a cross-sectional structure of a liquid crystal display having this TFT array substrate. Among the entire steps of manufacturing this liquid crystal display, steps other than those to which the present invention is applied are equivalent to known steps, and hence descriptions thereof are omitted.

As shown in FIG. 4, above the TFT array substrate, a plurality of transparent pixel electrodes 101 are provided in a matrix, and data lines 103, scanning lines 104, and capacitance lines 106 are provided along the respective longitudinal and lateral boundaries of the pixel electrodes 101. The data line 103 is electrically connected to a source region described later of a semiconductor layer 109 made of a polysilicon film through a contact hole 108, and the pixel electrode 101 is electrically connected to a drain region, which will be described later, of the semiconductor layer 109 through a contact hole 110. In addition, the scanning line 104 is disposed to oppose a channel region 111 of the semiconductor layer 109.

Figure 5:
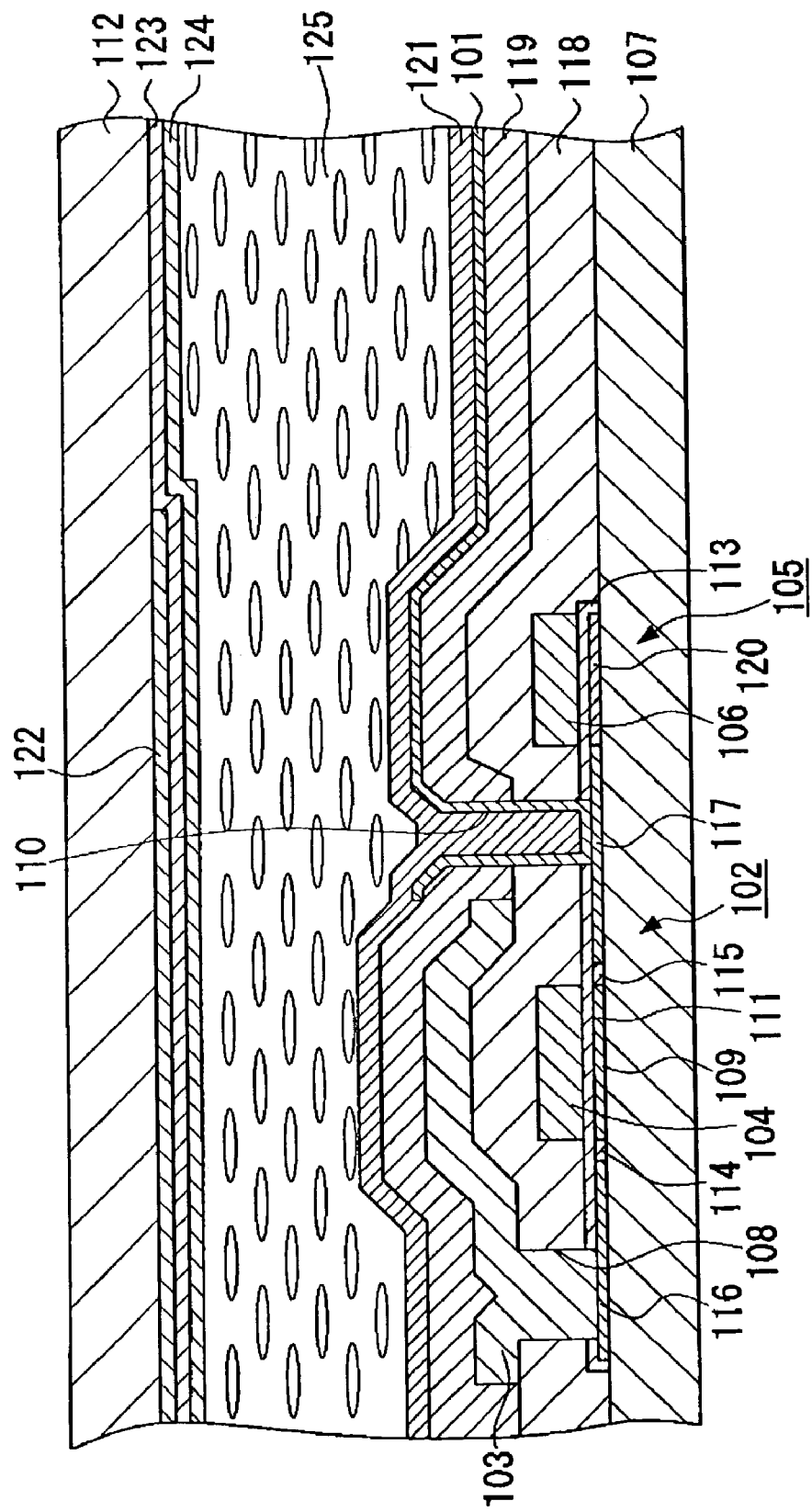
FIG. 5 is a cross-sectional view taken along the line A–A' in FIG. 4.
Figure 6:
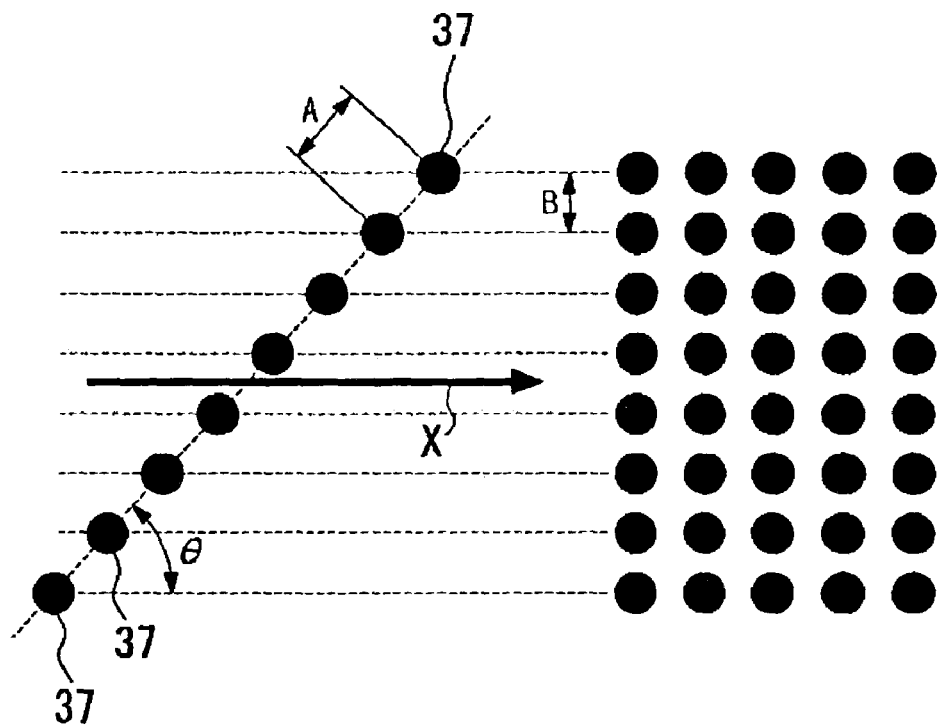
FIG. 6 is a view illustrating nozzle pitches when an angle of the droplet ejection head of the thin-film forming device of the first embodiment according to the present invention is changed.

As shown in FIG. 5, the liquid crystal display has a pair of transparent substrates, one of the transparent substrates is a TFT array substrate 107, and the other transparent substrate is a counter substrate 112 facing thereto. The pixel electrodes 101, each made of a transparent conductive thin film, are provided for the TFT array substrate 107, and at a position adjacent to each pixel electrode 101 above the TFT array substrate 107, a TFT 102 performing switching control of each pixel electrode 101 is provided. The TFT 102 has the LDD (lightly doped drain) structure and can include the scanning line 104, the channel region 111 of the semiconductor layer 109 in which a channel is formed by an electric field applied by the scanning line 104, an insulating thin film 113 insulating between the scanning line 104 and the semiconductor layer 109, the data line 103, a lightly doped source region 114 and a lightly doped drain region 115 of the semiconductor layer 109, and a heavily doped source region 116 and a heavily doped drain region 117 of the semiconductor layer 109.

In addition, on the scanning line 104, the insulating thin film 113, and the TFT array substrate 107, a first interlayer insulating film 118 is formed in which the contact hole 108 extending to the heavily doped source region 116 and the contact hole 110 extending to the heavily doped drain region 117 are formed. In other words, the data line 103 can be electrically connected to the heavily doped source region 116 through the contact hole 108 formed in the first interlayer insulating film 118. In addition, on the data line 103 and the first interlayer insulating film 118, a second interlayer insulating film 119 is formed in which the contact hole 110 extending to the highly doped drain region 117 is formed. That is, the highly doped drain region 117 is electrically connected to the pixel electrode 101 through the contact hole 110 which penetrates the first interlayer insulating film 118 and the second interlayer insulating film 119.

In addition, the insulating thin film 113 used as a gate insulating film is extended from a position facing the gate electrode, which is made of a part of the scanning line 104, to form a dielectric film, the semiconductor layer 109 is extended to form a first storage capacitance electrode 120, and a part of the capacitance line 106 facing thereto is used as a second storage capacitance electrode, thereby forming a storage capacitance 105.

In addition, on the counter substrate 112, a first shading film 122 functioning as a black matrix is formed in regions facing to those in which the data lines 103, the scanning lines 104, and the TFTs 102 are formed above the TFT array substrate 107, i.e., the non-display regions in each pixel. Furthermore, on the entire surface including the counter substrate 112 and the first shading film 122, a counter electrode 123 made of a transparent conductive thin film is provided.

On the second interlayer insulating film 119 and the pixel electrode 101, an alignment film 121 formed by the thin-film forming device described above is provided, and on the counter electrode 123 provided at the counter substrate 112 side, an alignment film 124 formed by the thin-film forming device described above is provided. These TFT array substrate 107 and the counter substrate 112 are disposed so that the pixel electrodes 101 and the counter electrode 123 oppose each other, and liquid crystal 125 is enclosed in a space surrounded by these substrates 107 and 112 and a sealing material (not shown).

Next, a method for forming the alignment film 121 described above will be described. After the pixel electrodes 101 are formed, a coating solution L (for example, JALS657 manufactured by JSR Corp.) for forming a polyimide-based alignment film 121 is applied onto the entire surface of the TFT array substrate 107 by the thin-film forming device described above, thereby forming a thin film having a uniform thickness of approximately 50 nm or the like. Subsequently, rubbing treatment is performed in a predetermined direction, thereby forming the alignment film 121. In addition, in a method for forming the alignment film 124, the coating solution L is applied onto the counter electrode 123 at the counter substrate 112 side by the thin-film forming device as in the case of the alignment film 121 to form a thin film, and subsequently, rubbing treatment is performed in a predetermined direction, thereby forming the alignment film 124. As described above, the TFT array substrate 107 and the counter substrate 112, prior to the formation of the alignment films 121 and 124, each correspond to the substrate SUB described above.

A method for coating the coating solution L for forming the alignment films 121 and 124 will be further described in detail. In order to control the thicknesses of the alignment films 121 and 124, when the coating solution L is applied onto the substrate SUB, the coating conditions can be changed by performing at least one operation control of the following controls using the control unit C of the thin-film forming device. In the following controls, the control unit C changes the coating conditions based on the actual thickness data in accordance with the coating conditions, which are obtained beforehand, so as to obtain a predetermined film thickness.

Film thickness control by ejection spatial intervals is performed by the control unit C is to control the film thicknesses of the alignment films 121 and 124 by changing the ejection spatial intervals of the coating solution L applied onto the substrate SUB as the coating conditions. That is, when the ejection spatial intervals are decreased, the coating amount per unit area on the surface of the substrate SUB is increased, thereby forming a thick film, and on the other hand, when the ejection spatial intervals are increased, the coating amount per unit area is decreased, thereby forming a thin film.

In more particular, by changing the relative moving speed between the droplet ejection head 1 and the substrate SUB, the ejection spatial intervals are changed. That is, when the moving speed is increased, the coating amount per unit moving length is decreased, thereby decreasing the film thickness, and on the other hand, when the moving speed is decreased, the coating amount per unit moving length is increased, thereby increasing the film thickness. For example, when coating is performed by moving the droplet ejection head 1 using the moving mechanism 3 in the X axis direction with respect to the substrate SUB, the film thickness can be decreased by increasing the moving speed in the X axis direction while ejection time intervals are maintained constant.

In addition, the ejection spatial intervals may be changed by changing ejection time intervals while the droplet ejection head 1 and the substrate SUB are relatively moved. That is, when the ejection time intervals are decreased, the coating amount per unit moving length is increased, thereby increasing the film thickness, and on the other hand, when the ejection time intervals are increased, the coating amount per unit moving length is decreased, thereby decreasing the film thickness. For example, when the ejection time intervals for ejecting the coating solution L by the ejection mechanism 2 are decreased while the moving speed of the droplet ejection head 1 by the moving mechanism 3 is maintained constant, the film thickness can be increased.

Furthermore, the ejection spatial intervals may be changed by optionally assigning some nozzles 37 among said plurality of nozzles 37 to simultaneously eject the coating solution L. That is, when the number of the nozzles 37 performing simultaneous ejection is larger, and the distances between the nozzles 37 described above are smaller, the coating amount per unit area becomes larger, thereby increasing the film thickness. On the other hand, when the number of the nozzles 37 performing simultaneous ejection is smaller, and the distances between the nozzles 37 described above are larger, the coating amount per unit area becomes smaller, thereby decreasing the film thickness. That is, for example, when every other nozzle 37 among those which are aligned at regular intervals is assigned to eject the coating solution L, the ejection spatial intervals become two times that obtained in the case in which all the nozzles 37 eject the coating solution L, and hence the film thickness can be decreased to one half of that obtained in the case described above.

In this embodiment, for example, the ejection spatial intervals are controlled in the range of from 1 to 100 μm.

Film thickness control by ejection amount is performed by the control unit C is to control the film thickness by changing the ejection amount of the coating solution L per dot as the coating conditions. That is, since the coating amount per unit area is changed in proportion to the ejection amount, the film thickness can be increased when the ejection amount is increased, and on the other hand, when the ejection amount is decreased, the film thickness can be decreased. For example, when a drive voltage applied to the piezoelectric element 39 of the droplet ejection head 1 is changed in the range of from 0.1 to 34.9 V by the ejection mechanism 2, and an appropriate drive waveform is selected, the ejection amount per dot can be changed from approximately 2 to 20 picoliters, and hence the film thickness can be controlled with high accuracy.

In addition, by changing the ejection amount ejected from each nozzle 37 using the control unit C, the film thickness may be controlled. That is, the coating amount can be optionally changed by the ejection mechanism 2 in accordance with the position of each nozzle 37 and the ejection amount therefrom, and hence various control of the film thickness can be performed. For example, when each other nozzle 37 among those which are aligned at regular intervals is assigned to eject a decreased amount per dot, compared to the case in which all the nozzles 37 eject the same amount, the coating amount is decreased, and hence the film thickness can be decreased.

Film thickness control by angle of nozzle alignment direction is performed by the control unit C is to control the film thickness by changing an angle formed by the alignment direction of the nozzles and the moving direction by the moving mechanism. For example, when the angle θ formed by the alignment direction of the nozzles 37 and the moving direction (for example, the X axis direction) is decreased by rotating the droplet ejection head 1 using the head supporter 5 as shown in FIG. 6, an apparent nozzle pitch B is decreased as compared to an actual nozzle pitch A, and hence the coating amount per unit moving length can be increased, thereby increasing the film thickness.

In film thickness control by repeated coating, when coating is repeatedly performed on the substrate SUB, the coating conditions for each coating is selected from at least one of the film thickness controls described above by the control unit C. For example, the coating conditions performed for first coating can be changed for subsequent coating in consideration of characteristics such as a drying characteristic (volatility) of the coating solution L, and hence coating can be repeatedly performed under appropriate conditions in consideration of the state of the coating solution L.

Film Thickness control by regions is performed by the control unit C, since coating is performed for each of a plurality of regions on the surface of the substrate SUB under the coating conditions using at least one of the film thickness controls described above, the film thickness can be optionally set in each region, and in addition, by finely adjusting the coating amount for each region in consideration of characteristics such as a drying characteristic (volatility) of the coating solution L in said each region, more highly accurate uniformity of the film thickness can be obtained. For example, due to the volatility of the coating solution L, when the film thickness of at the peripheral portion of the substrate SUB tends to be large as compared to that at the central portion thereof, the film is divided into two regions, i.e., the peripheral portion and the central portion of the substrate SUB, and the coating amount is controlled by the coating conditions so that the thickness at the peripheral portion is smaller than that of the central portion beforehand, thereby obtaining superior thickness uniformity on the whole.

Figure 7:
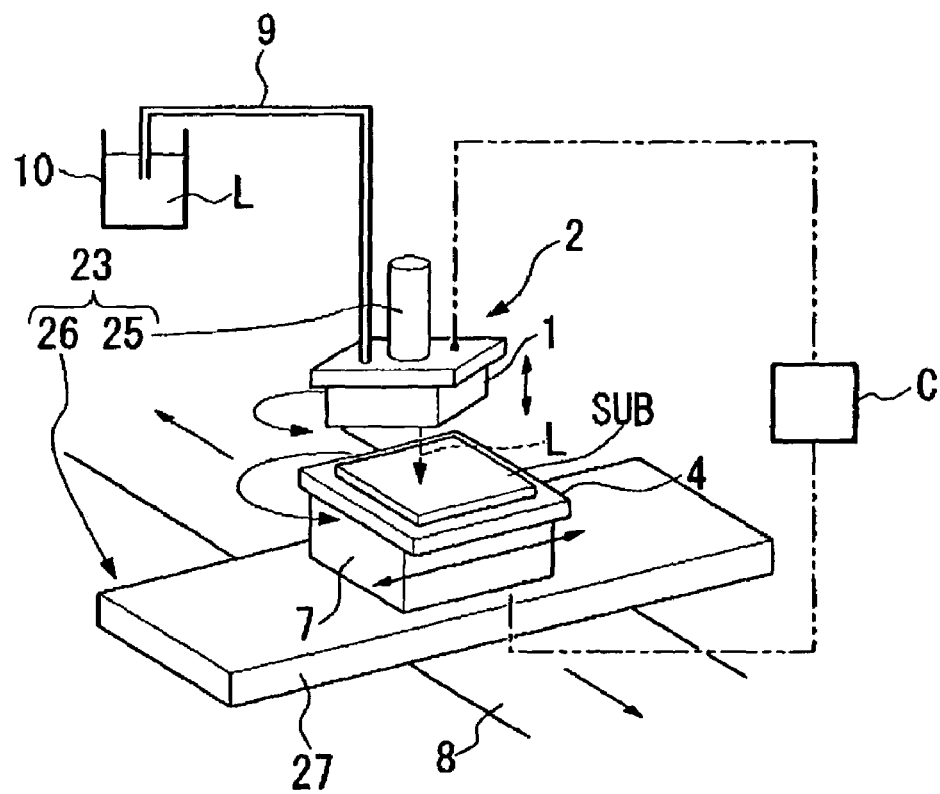
FIG. 7 is a perspective view showing the schematic structure of a thin-film forming device of a second embodiment according to the present invention.

Next, a second embodiment of the present invention will be described with reference to FIG. 7.

The points of the second embodiment differ from those of the first embodiment are as follows. The moving mechanism 3 of the thin-film forming device of the first embodiment is provided with the head supporter 5 capable of moving the droplet ejection head 1 in the X axis direction and the stage driver 6 having the Y axis stage 8 capable of moving the substrate stage 4 in the Y axis direction, and in a thin-film forming device of the second embodiment, as shown in FIG. 7, a moving mechanism 23 is provided with a head supporter 25 having no moving function of moving the droplet ejection head 1 in the X axis direction and a stage driver 26 having an X axis stage 27 capable of moving the substrate stage 4 in both the X axis and the Y axis directions and capable of positioning it.

That is, in this embodiment, the movement in the horizontal plane (X axis direction and Y plane direction) of the droplet ejection head 1 and the substrate SUB on the substrate stage 4 for relative movement and positioning is controlled by the stage driver 26 side. Accordingly, in the film thickness control performed by the control unit C described above, the control of moving operation in the horizontal plane by the moving mechanism 23 is primarily performed by the X axis stage 27 and the Y axis stage 8 of the stage driver 26.

Hereinafter, particular examples of electronic apparatuses will be described each provided with the liquid crystal display of the present invention.

Figure 8:
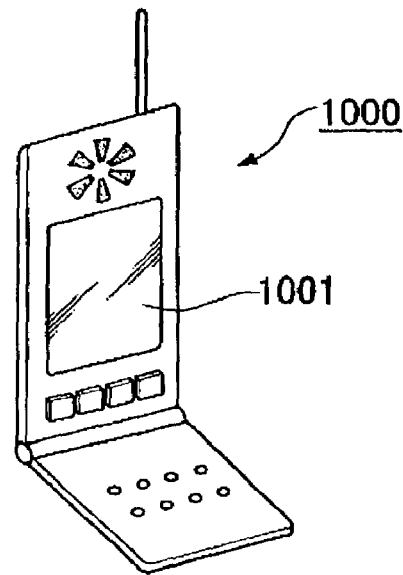
FIG. 8 is a perspective view showing an example of an electronic apparatus provided with a liquid crystal display of one embodiment according to the present invention.

FIG. 8 is a perspective view showing an example of a mobile phone. In FIG. 8, reference numeral 1000 indicates a mobile phone body, and reference numeral 1001 indicates a liquid crystal display portion using the liquid crystal display described above.

Figure 9:
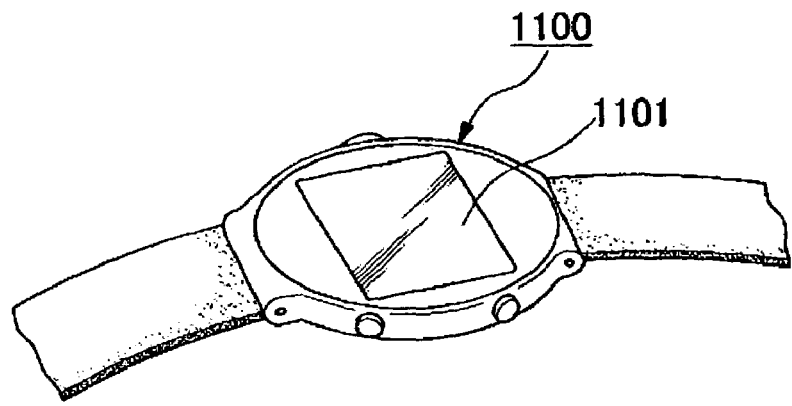
FIG. 9 is a perspective view showing another example of an electronic apparatus provided with a liquid crystal display of one embodiment according to the present invention.

FIG. 9 is a perspective view showing an example of a wristwatch-shaped electronic apparatus. In FIG. 9, reference numeral 1100 indicates a watch body, and reference numeral 1101 indicates a liquid crystal display portion using the liquid crystal display described above.

Figure 10:
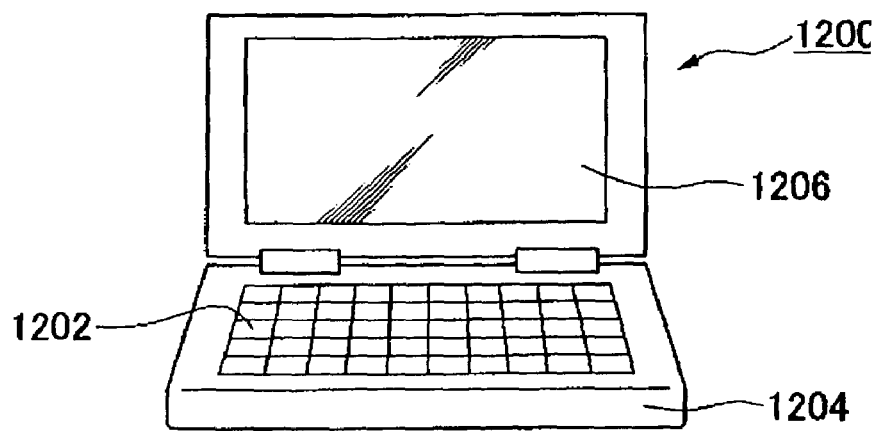
FIG. 10 is a perspective view showing still another example of an electronic apparatus provided with a liquid crystal display of one embodiment according to the present invention.

FIG. 10 is a perspective view showing an example of a mobile information processing apparatus such as a word processor or a personal computer. In FIG. 10, reference numeral 1200 indicates an information processing apparatus, reference numeral 1202 indicates an input portion such as a keyboard, reference numeral 1204 indicates an information processing body, and reference numeral 1206 indicates a liquid crystal display portion using the liquid crystal display described above.

The electronic apparatuses shown in FIGS. 8 to 10 are each provided with the liquid crystal display portion using the liquid crystal display described above, and hence an electronic apparatus having superior display quality can be obtained because of the use of the alignment film or insulating film having superior thickness uniformity.

In addition, it should be understood that the present invention is not limited to the embodiments described above and may be variously modified without departing from the spirit and the scope of the present invention.

For example, in the embodiments described above, the thin-film forming device can be used for forming the alignment film in the process for manufacturing the liquid crystal display; however, the thin-film forming device may be used for forming another thin-film. For example, the thin-film forming technique of the present invention may be used for forming the second interlayer insulating film 119 in the process for manufacturing the liquid crystal display described above. In the case described above, an interlayer insulating film having superior thickness uniformity over the entire substrate can be obtained. As the coating solution, a liquid material for forming an organic film, SOG, or the like may be used for forming the interlayer insulating film.

In addition, the present invention may be applied to the formation of a protection film of an organic EL panel. That is, an insulating protection film formed on electrodes of the organic EL panel may be formed by the thin-film forming method and the thin-film forming device of the present invention. The steps of manufacturing the entirety of this organic EL panel other than the protection-film forming step to which the present invention is applied are equivalent to known manufacturing steps.

In addition, as the coating solution, various liquid thin-film forming materials may be used, and by using a photoresist solution, the thin-film forming technique of the present invention may be applied to the formation of a resist film in a photolithographic step performed in a manufacturing process for a liquid crystal display, a semiconductor device, or the like. In the case described above, the thickness of the resist film can be controlled with high accuracy, and hence superior exposure accuracy can be obtained.

In addition, in the embodiments described above, the thin-film forming technique of the present invention can be used as a technique for forming the liquid crystal display having a multilayer structure in which a plurality of thin films including an alignment film is provided on the substrate. However, it should be understood that the thin-film forming technique of the present invention may be applied to the formation of another thin-film structure. For example, the present invention may be applied to a technique for forming a thin-film structure such as an optical disc in which a protection film is provided on the surface thereof. In the case described above, a protection film can be obtained having superior thickness uniformity over the entire optical disc substrate. In particular, when a UV curable resin solution is used as the coating solution, a protection film can be formed which prevents degradation of a metal-deposition film of an optical disc.

As has thus been described, according to the thin-film forming device and the thin-film forming method of the present invention, at least one of the ejection operation and the moving operation performed by the ejection mechanism and the moving mechanism, respectively, is controlled by the control unit so as to change the coating conditions, thereby controlling the thickness of the thin film. Accordingly, the thickness control of the thin film can be easily and highly accurately performed without using rotation means for rotating the substrate, and in addition, the device can be miniaturized and can be manufactured at lower cost.

In addition, in the device for manufacturing the liquid crystal display, the method for manufacturing the liquid crystal display, the liquid crystal display, and the electronic apparatus of the present invention, at least one of the alignment film and the insulating film is formed by the thin-film forming device and the thin-film forming method of the present invention, and hence an alignment film and insulating film having superior thickness uniformity over the entire substrate can be easily obtained.

Furthermore, in the device for manufacturing the thin-film structure, the method for manufacturing the thin-film structure, and the thin-film structure of the present invention, the thin-film is formed by the thin-film forming device or the thin-film forming method of the present invention described above, for example, even in the thin-film structure such as an optical disc, a thin film such as a protection film having superior thickness uniformity over the entire optical disc substrate can be easily obtained.

What is claimed is:

1. A thin-film forming method for forming a thin film, which applies a coating solution onto a substrate by using:

an ejection mechanism having a droplet ejection head that ejects the coating solution onto the substrate;

a moving mechanism capable of relatively moving the positions of the droplet ejection head and the substrate; and a control unit that controls at least one of the ejection mechanism and the moving mechanism, the method comprising:

changing coating conditions of the coating solution by controlling at least one of an ejection operation by the ejection mechanism and a moving operation by the moving mechanism by using the control unit so as to control a thickness of the thin film; and changing ejection spatial intervals for ejecting the coating solution onto the substrate by changing a speed of the moving operation.

2. A thin-film forming method for forming a thin film, which applies a coating solution onto a substrate by using:

an ejection mechanism having a droplet ejection head that ejects the coating solution onto the substrate;

a moving mechanism capable of relatively moving the positions of the droplet ejection head and the substrate; and a control unit that controls at least one of the ejection mechanism and the moving mechanism, the method comprising:

changing coating conditions of the coating solution by controlling at least one of an ejection operation by the ejection mechanism and a moving operation by the moving mechanism by using the control unit so as to control a thickness of the thin film; and changing ejection spatial intervals for ejecting the coating solution onto the substrate by changing time intervals for the ejection during the moving operation.

3. The thin-film forming method according to claim 1, the droplet ejection head being provided with a plurality of nozzles aligned in at least one line, and the control unit optionally assigning some nozzles among said plurality of nozzles to simultaneously eject the coating solution for changing the ejection spatial intervals.

4. The thin-film forming method according to claim 1, the control unit changing the ejection amount of the coating solution per dot.

5. The thin-film forming method according to claim 1, the droplet ejection head being provided with a plurality of nozzles aligned in at least one line, and the control unit changing an ejection amount ejected from each of said plurality of nozzles.

6. The thin-film forming method according to claim 1, the droplet ejection head being provided with a plurality of nozzles aligned in at least one line, and the control unit changing an angle formed by an alignment direction of the nozzles and a moving direction by the moving mechanism.

7. The thin-film forming method according to claim 1, the control unit setting the coating conditions for each of coating steps which are repeatedly performed on the substrate.

8. The thin-film forming method according to claim 1, the control unit setting the coating conditions for each of a plurality of regions on the substrate.

9. The thin-film forming method according to claim 1, the coating solution being a photoresist solution.

10. A method for manufacturing a liquid crystal display comprising a pair of substrates, liquid crystal provided therebetween, and an alignment film and an insulating film provided on at least one of the substrates, the method comprising:

forming at least one of an alignment film and an insulating film by a thin-film forming method according to claim 1.

11. A method for manufacturing a thin-film structure having a substrate and a thin film provided thereon, the method comprising:

providing the substrate; and forming the thin film on the substrate by using:

an ejection mechanism having a droplet ejection head that ejects a coating solution onto the substrate, a moving mechanism capable of relatively moving the positions of the droplet ejection head and the substrate, and a control unit that controls at least one of the ejection mechanism and the moving mechanism; and changing coating conditions of the coating solution by controlling at least one of an ejection operation by the ejection mechanism and a moving operation by the moving mechanism by using the control unit so as to control a thickness of the thin film; and changing ejection spatial intervals for ejecting the coating solution onto the substrate by changing (i) a speed of the moving operation or (ii) time intervals for the ejection during the moving operation.

* * * * *